United States Patent
Iizuka et al.

(10) Patent No.: US 10,198,021 B2
(45) Date of Patent: Feb. 5, 2019

(54) VOLTAGE GENERATION CIRCUIT HAVING A TEMPERATURE COMPENSATION FUNCTION

(71) Applicant: SAMSUNG ELECTRO-MECHANICS CO., LTD., Suwon-si (KR)

(72) Inventors: Shinichi Iizuka, Suwon-si (KR); Jong Ok Ha, Suwon-si (KR); Jeong Hoon Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/671,197

(22) Filed: Aug. 8, 2017

(65) Prior Publication Data

US 2018/0181155 A1 Jun. 28, 2018

(30) Foreign Application Priority Data

Dec. 28, 2016 (KR) .................. 10-2016-0180987

(51) Int. Cl.
*G05F 3/24* (2006.01)
*H03K 3/011* (2006.01)
(Continued)

(52) U.S. Cl.
CPC .............. *G05F 3/245* (2013.01); *G05F 1/462* (2013.01); *G05F 1/567* (2013.01); *H03K 3/011* (2013.01)

(58) Field of Classification Search
CPC .......... G05F 3/245; G05F 1/462; G05F 1/567; H03K 3/011
See application file for complete search history.

(56) References Cited

U.S. PATENT DOCUMENTS

| 6,268,817 B1 * | 7/2001 | Min .................. H03M 1/682 341/145 |
| 2006/0197585 A1 | 9/2006 | Kim et al. |

(Continued)

FOREIGN PATENT DOCUMENTS

| GB | 2503961 A | 1/2014 |
| KR | 10-2005-0117773 A | 12/2005 |

(Continued)

OTHER PUBLICATIONS

Korean Office Action dated Jan. 16, 2018 in corresponding Korean Patent Application No. 10-2016-0180987 (5 pages in English and 4 pages in Korean).

*Primary Examiner* — Jue Zhang
(74) *Attorney, Agent, or Firm* — NSIP Law

(57) ABSTRACT

A voltage generation circuit having a temperature compensation function includes a first voltage generation circuit, a second voltage generation circuit, an output voltage control circuit, and a voltage selection circuit. The first voltage generation circuit is configured to generate a first voltage having a zero temperature coefficient, determined in response to a first control signal. The second voltage generation circuit is configured to generate a second voltage having a positive temperature coefficient, determined in response to a second control signal. The output voltage control circuit is configured to control an output of one of the first voltage and the second voltage in response to an operating mode. The voltage selection circuit is configured to select the first voltage or the second voltage in response to the output voltage control circuit.

19 Claims, 7 Drawing Sheets

(51) Int. Cl.
  *G05F 1/46*     (2006.01)
  *G05F 1/567*    (2006.01)

(56) References Cited

U.S. PATENT DOCUMENTS

| | | |
|---|---|---|
| 2008/0180161 A1 | 7/2008 | Jo et al. |
| 2014/0049245 A1 | 2/2014 | Kim et al. |
| 2016/0098048 A1* | 4/2016 | Sharma ............... H03F 3/45771 327/513 |

FOREIGN PATENT DOCUMENTS

| | | |
|---|---|---|
| KR | 10-0707306 B1 | 4/2007 |
| KR | 10-2008-0070194 A | 7/2008 |
| KR | 10-2010-0062210 A | 6/2010 |
| KR | 10-2013-0060756 A | 6/2013 |
| KR | 10-2014-0023749 A | 2/2014 |

\* cited by examiner

VOLTAGE GENERATION CIRCUIT HAVING A TEMPERATURE COMPENSATION FUNCTION

CROSS-REFERENCE TO RELATED APPLICATION(S)

This application claims the benefit under 35 USC 119(a) of Korean Patent Application No. 10-2016-0180987, filed on Dec. 28, 2016 in the Korean Intellectual Property Office, the entire disclosure of which is incorporated herein by reference for all purposes.

BACKGROUND

1. Field

The following description relates to a voltage generation circuit having a temperature compensation function.

2. Description of Related Art

Generally, characteristics of circuits handling signals and voltages deteriorate based on temperature changes, and a temperature compensation circuit for preventing such deterioration is required. For example, a bias circuit, or a circuit for generating a reference voltage, needs a temperature compensation circuit in order to generate a predetermined level of voltage for a change in temperature.

Further, the important characteristics of an analog circuit or an RF circuit change according to temperatures. For example, even when the characteristics meet the performance of the analog or RF circuit at room temperature, they may be degraded at low or high temperatures. To compensate for this, either a bias voltage circuit or a reference voltage circuit (hereinafter, referred to as a "voltage generation circuit") of a corresponding circuit requires a temperature compensation function to compensate for temperature, according to temperature coefficients.

A voltage generation circuit of the related art may use, for example, a method of adjusting only the slope of temperature coefficients.

However, the method of adjusting only the slope of temperature coefficients in the voltage generation circuit of the related art as described above cannot satisfy the required temperature coefficients of certain respective circuits, such as various types of power amplifiers, or the like.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter. In one general aspect, a voltage generation circuit having a temperature compensation function includes a first voltage generation circuit, a second voltage generation circuit, an output voltage control circuit, and a voltage selection circuit. The first voltage generation circuit is configured to generate a first voltage having a zero temperature coefficient, determined in response to a first control signal. The second voltage generation circuit is configured to generate a second voltage having a positive temperature coefficient, determined in response to a second control signal. The output voltage control circuit is configured to control an output of one of the first voltage and the second voltage in response to an operating mode. The voltage selection circuit is configured to select the first voltage or the second voltage in response to the output voltage control circuit.

The first voltage generation circuit may include a first resistor circuit comprising resistors connected in series between a terminal receiving a first zero-to-absolute-temperature (ZTAT) voltage and a ground; and a switch circuit comprising switches connected between each connection node between the resistors and a first output node of the first voltage generation circuit, the switch circuit configured to switch in response to the first control signal.

The second voltage generation circuit may include a second resistor circuit connected between a terminal receiving a second ZTAT voltage and a second output node of the second voltage generation circuit, to provide a second resistance value; and a variable resistor circuit connected between a terminal receiving a proportional-to-absolute temperature (PTAT) voltage and the second output node, to provide a variable resistance value varying in response to the second control signal.

The output voltage control circuit may include a mode setting circuit configured to set one of a plurality of operating modes in response to a mode selection signal; a comparison circuit configured to compare the first voltage with the second voltage and output a comparison result signal; and an output voltage controller configured to provide an output voltage selection signal in response to the operating mode set by the mode setting circuit and in response to the comparison result signal from the comparison circuit.

The voltage selection circuit may include a first switch configured to switch in response to a first switch signal of the output voltage selection signal, to select and output the first voltage to an output terminal; and a second switch configured to switch in response to a second switch signal of the output voltage selection signal, the second switch signal having a phase opposite a phase of the first switch signal, to select and output the second voltage to the output terminal.

The mode setting circuit may have a temperature compensation function of setting one of a first operating mode, a second operating mode, a third operating mode, and a fourth operating mode in response to the mode selection signal.

The output voltage controller may be configured to: control the first switch to turn on in response to the first and second switch signals when the mode setting circuit sets the first operating mode; control the second switch to turn on in response to the first and second switch signals when the mode setting circuit sets the second operating mode; control the second switch to turn on to select the second voltage when the second voltage is lower than the first voltage, and control the first switch to turn on to select the first voltage when the second voltage is higher than the first voltage, in response to the first and second switch signals in the third operating mode set by the mode setting circuit; and control the first switch to turn on to select the first voltage when the first voltage is higher than the second voltage, and control the second switch to be turned on to select the second voltage when the first voltage is lower than the second voltage, in response to the first and second switch signals in the fourth operating mode set by the mode setting circuit.

In another general aspect, a voltage generation circuit having a temperature compensation function includes a first voltage generation circuit, a second voltage generation circuit, an output voltage control circuit, and a voltage selection circuit. The first voltage generation circuit is configured to generate a first voltage by varying a first ZTAT voltage having a zero temperature coefficient in response to a first control signal. The second voltage generation circuit is configured to generate a second voltage based on a second ZTAT voltage having a zero temperature coefficient and a PTAT voltage having a positive temperature coefficient in response to a first control signal. The output voltage control circuit is configured to control an output of one of the first voltage and the second voltage, based on the magnitudes of the first voltage and the second voltage, in response to an operating mode. The voltage selection circuit is configured to select one of the first voltage and the second voltage under the control of the output voltage control circuit.

The voltage generation circuit may further include a first buffer connected between the first voltage generation circuit and the voltage selection circuit; and a second buffer connected between the second voltage generation circuit and the voltage selection circuit.

The first voltage generation circuit may include a first resistor circuit comprising resistors connected in series each to the other between a terminal receiving a first ZTAT voltage and a ground; and a switch circuit comprising switches connected between each connection node between the resistors and a first output node of the first voltage generation circuit, and configured to switch in response to the first control signal.

The second voltage generation circuit may include a second resistor circuit connected between a terminal receiving a second ZTAT voltage and a second output node of the second voltage generation circuit, to provide a second resistance value; and a variable resistor circuit connected between a terminal receiving the PTAT voltage and the second output node, to provide a variable resistance value varying in response to the second control signal, wherein $$V^2 = V\_ZTAT^2 + \frac{RZ}{RZ + VRP} * (V\_PTAT - V\_ZTAT^2),$$

where V2 is the second voltage, V_ZTAT2 is the second ZTAT voltage, VRP is the variable resistance value, RZ is the second resistance value, and V_PTAT is the PTAT voltage.

The output voltage control circuit may include a mode setting circuit configured to set one of a plurality of operating modes in response to a mode selection signal; a comparison circuit configured to compare the first voltage with the second voltage and output a comparison result signal; and an output voltage controller configured to provide an output voltage selection signal in response to the operating mode set by the mode setting circuit and in response to the comparison result signal from the comparison circuit.

The voltage selection circuit may include a first switch configured to switch in response to a first switch signal of the output voltage selection signal, to select and output the first voltage to an output terminal; and a second switch configured to switch in response to a second switch signal of the output voltage selection signal, the second switch signal having a phase opposite a phase of the first switch signal, to select and output the second voltage to the output terminal.

The mode setting circuit may set one of a first operating mode, a second operating mode, a third operating mode, and a fourth operating mode in response to the mode selection signal.

The output voltage controller may be configured to: control the first switch to turn on in response to the first and second switch signals when the mode setting circuit sets the first operating mode; control the second switch to turn on in response to the first and second switch signals when the mode setting circuit sets the second operating mode; control the second switch to turn on to select the second voltage when the second voltage is lower than the first voltage, and control the first switch to turn on to select the first voltage when the second voltage is higher than the first voltage, in response to the first and second switch signals in the third operating mode set by the mode setting circuit; and control the first switch to turn on to select the first voltage when the first voltage is higher than the second voltage, and control the second switch to turn on to select the second voltage when the first voltage is lower than the second voltage, in response to the first and second switch signals in the fourth operating mode set by the mode setting circuit.

In another general aspect, a voltage generation circuit having a temperature compensation function includes a first voltage generation circuit, a second voltage generation circuit, an output voltage control circuit, and a voltage selection circuit. The first voltage generation circuit is configured to generate a first zero-to-absolute-temperature (ZTAT) voltage having a zero temperature coefficient in response to a first control signal. The first voltage generation circuit includes resistors connected in series each to the other and switches. The resistors are connected between a terminal receiving a first ZTAT voltage and a ground, and the switches are connected between each connection node between the resistors and a first output node of the first voltage generation circuit. The second voltage generation circuit is configured to generate a second ZTAT voltage having a zero temperature coefficient and a PTAT voltage having a positive temperature coefficient in response to a second control signal. The second voltage generation circuit includes a second resistor circuit and a variable resistor circuit. The second resistor circuit is connected between a terminal receiving a second ZTAT voltage and a second output node of the second voltage generation circuit, and the variable resistor circuit is connected between a terminal receiving the PTAT voltage and the second output node. The output voltage control circuit is configured to control an output of the first voltage or the second voltage, based on magnitudes of the first voltage and the second voltage, in response to an operating mode. The voltage selection circuit is configured to select the first voltage or the second voltage based on the output of the voltage control circuit.

The output voltage control circuit may include a mode setting circuit configured to set one of a plurality of operating modes in response to a mode selection signal; a comparison circuit configured to compare the first voltage with the second voltage and output a comparison result signal; and an output voltage controller configured to provide an output voltage selection signal in response to the operating mode set by the mode setting circuit and in response to the comparison result signal from the comparison circuit.

The voltage selection circuit may include a first switch configured to switch in response to a first switch signal of the output voltage selection signal, to select and output the first voltage to an output terminal; and a second switch configured to switch in response to a second switch signal of the output voltage selection signal, the second switch signal having a phase opposite a phase of the first switch signal, to select and output the second voltage to the output terminal.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
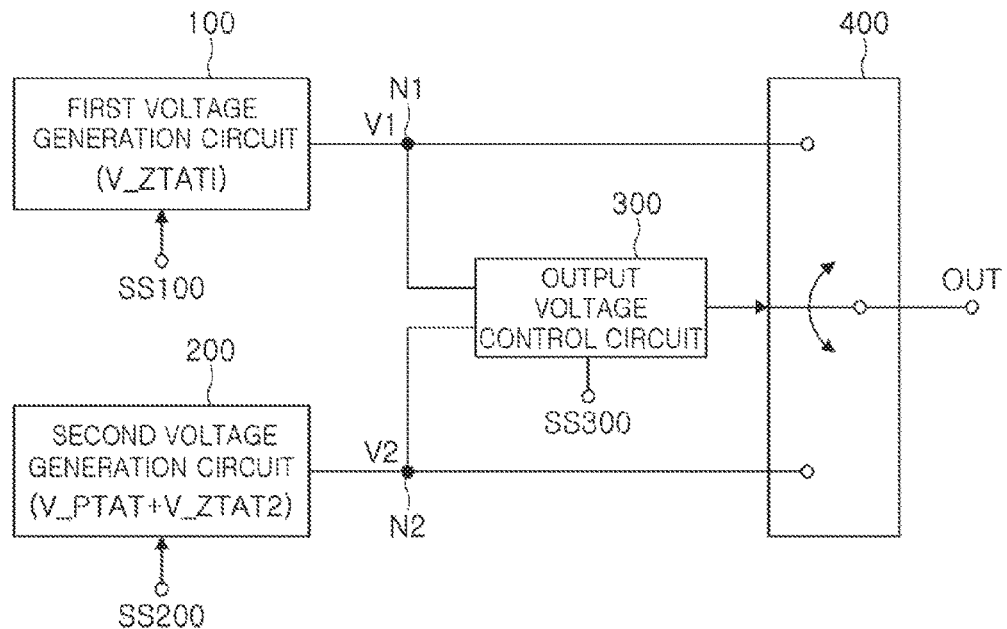
FIG. 1 is a circuit diagram of an example of a voltage generation circuit having a temperature compensation function.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

The examples described below provide a voltage generation circuit that selects one or any combination of a proportional-to-absolute temperature (PTAT) characteristic, and a zero-to-absolute-temperature (ZTAT) in lieu of a method of adjusting the slope temperature coefficients.

FIG. 1 is a circuit diagram of an example of a voltage generation circuit having a temperature compensation function.

Referring to FIG. 1, the voltage generation circuit having the temperature compensation function includes a first voltage generation circuit 100, a second voltage generation circuit 200, an output voltage control circuit 300, and a voltage selection circuit 400.

The first voltage generation circuit 100 generates a first voltage V1 having a zero temperature coefficient (ZTAT), determined in response to a first control signal SS100. The ZTAT refers to a coefficient whose size is not changed regardless of temperature change.

The first voltage V1 is obtained by varying a first ZTAT voltage V_ZTAT1 having the ZTAT according to the first control signal SS100.

An example of the first voltage generation circuit 100 will be described with reference to FIG. 3.

The second voltage generation circuit 200 generates a second voltage V2 having a positive temperature coefficient (PTAT), determined according to a second control signal SS200. The PTAT refers to a coefficient proportionate to temperature change.

For example, the second voltage V2 may be generated by using a second ZTAT voltage V_ZTAT2, having the ZTAT, and a PTAT voltage V_PTAT, having the PTAT, according to the second control signal SS200.

An example of the second voltage generation circuit 200 will be described with reference to FIG. 4.

The output voltage control circuit 300 controls an output of one of the first voltage V1 and the second voltage V2 in an operating mode, set according to a mode selection signal SS300. In one example, the operating mode is one of a first operating mode M1, a second operating mode M2, a third operating mode M3, and a fourth operating mode M4.

An example of the output voltage generation circuit 300 will be described with reference to FIG. 5.

The voltage selection circuit 400 selects one of the first voltage V1 and the second voltage V2 under the control of the output voltage control circuit 300.

For example, the first operating mode M1 may be provided to select the first voltage V1, the second operating mode M2 may be provided to select the second voltage V2, the third operating mode M3 may be provided to select the second voltage V2 and the first voltage V1 sequentially, and the fourth operating mode M4 may be provided to select the first voltage V1 and the second voltage V2 sequentially.

In each drawing of the present disclosure, unnecessarily repeated descriptions of the components having the same reference numerals and the same functions will be omitted.

Figure 2:
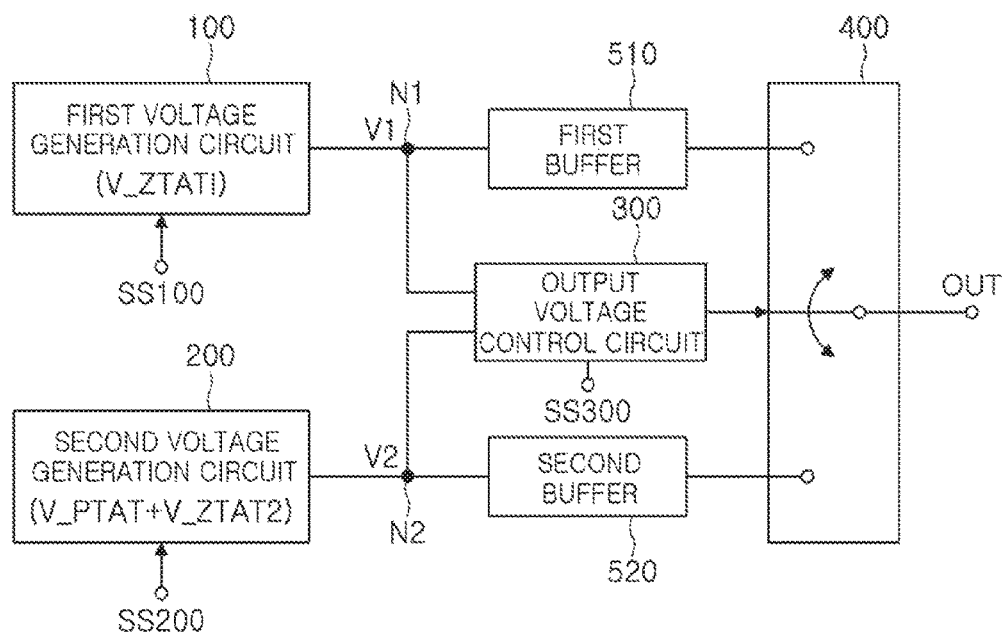
FIG. 2 is a circuit diagram of another example of a voltage generation circuit having a temperature compensation function.

FIG. 2 is a circuit diagram of another example of a voltage generation circuit having a temperature compensation function.

The voltage generation circuit illustrated in FIG. 2 further includes a first buffer 510 and a second buffer 520, in addition to the voltage generation circuit illustrated in FIG. 1.

The first buffer 510 is connected between the first voltage generation circuit 100 and the voltage selection circuit 400. In one example, the first buffer 510 transfers the first voltage V1 from the first voltage generation circuit 100 to the voltage selection circuit 400 between the first voltage generation circuit 100 and the voltage selection circuit 400, and prevents a signal and noise from the voltage selection circuit 400 from being transferred to the first voltage generation circuit 100.

The second buffer 520 is connected between the second voltage generation circuit 200 and the voltage selection circuit 400. In one example, the second buffer 520 transfers the second voltage V2 from the second voltage generation circuit 200 to the voltage selection circuit 400 between the second voltage generation circuit 200 and the voltage selection circuit 400, and prevents a signal and noise from the voltage selection circuit 400 from being transferred to the second voltage generation circuit 200.

Figure 3:
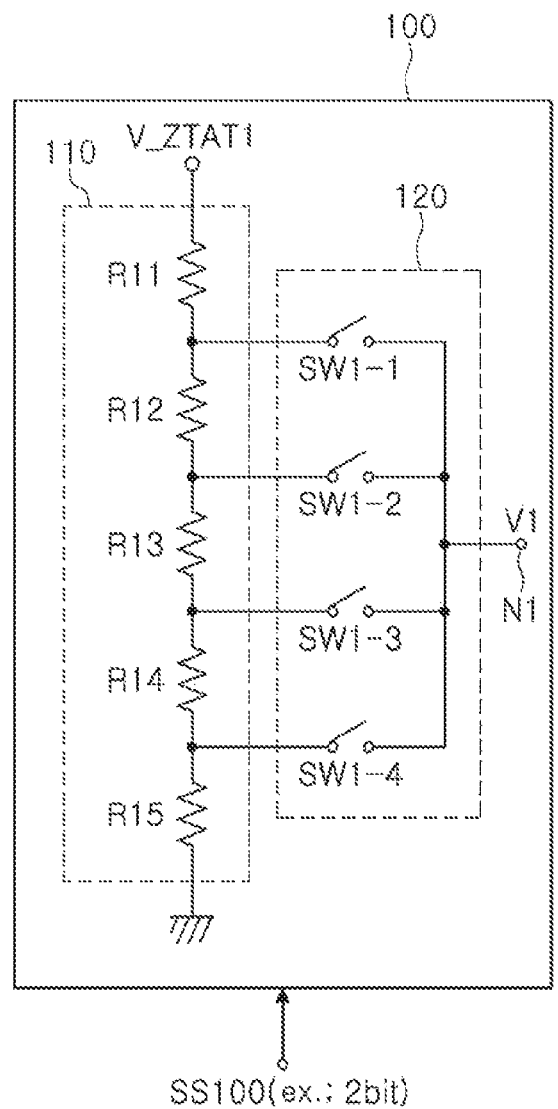
FIG. 3 is a circuit diagram of an example of a first voltage generation circuit.

FIG. 3 is a circuit diagram of an example of the first voltage generation circuit 100.

Referring to FIG. 3, the first voltage generation circuit 100 includes a first resistor circuit 110 and a switch circuit 120.

The first resistor circuit 110 includes a plurality of resistors connected in series between a terminal receiving the first ZTAT voltage V_ZTAT1 and a ground. The resistors include at least two resistors, for example, five resistors R11 to R15.

The switch circuit 120 includes a plurality of switches connected between each connection node between the resistors R11 to R15 and a first output node N1 of the first voltage generation circuit 100 and switching according to the first control signal.

The switches include four switches SW1-1 to SW1-4, but are not limited thereto. In an example, the first control signal SS100 consists of four switching signals in which a 2-bit signal is decoded, so as to operate the four switches SW1-1 to SW1-4.

Figure 4:
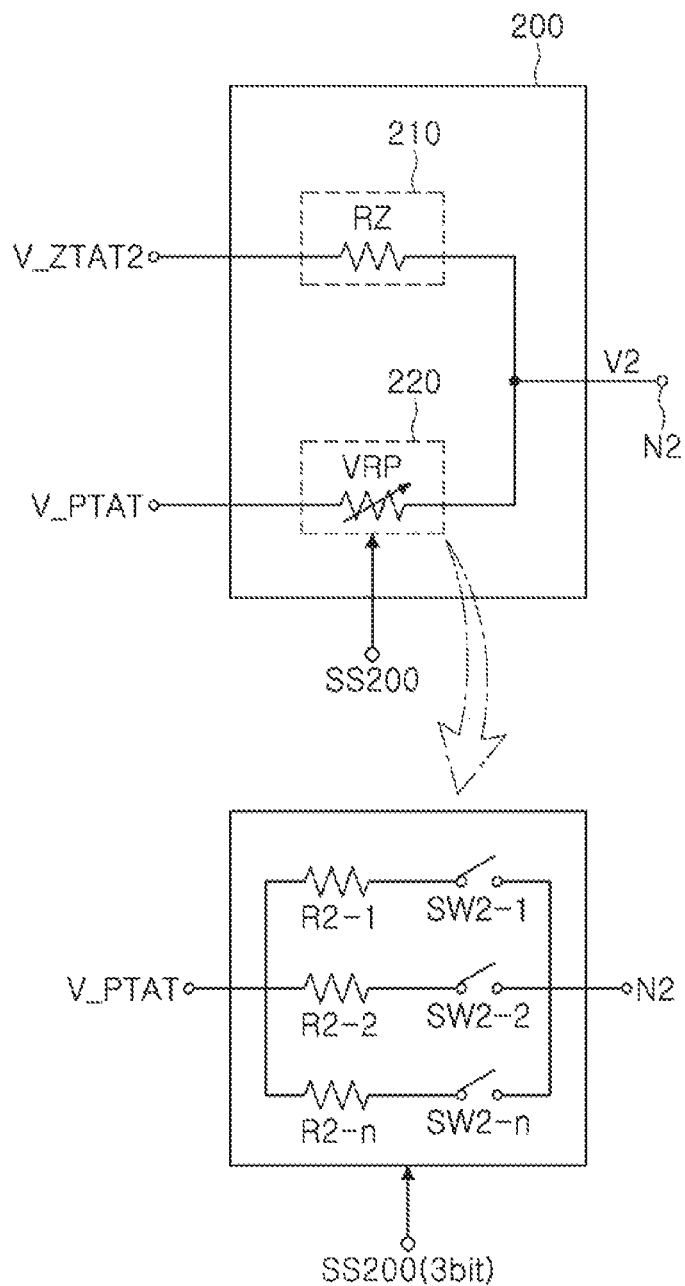
FIG. 4 is a circuit diagram of an example of a second voltage generation circuit.

FIG. 4 is a circuit diagram of an example of the second voltage generation circuit 200.

Referring to FIG. 4, the second voltage generation circuit 200 includes a second resistor circuit 210 and a variable resistor circuit 220.

The second resistor circuit is connected between a terminal receiving the second ZTAT voltage V_ZTAT2 and a second output node N2 of the second voltage generation circuit 200, to provide a second resistance value RZ.

The variable resistor circuit 220 is connected between a terminal receiving the PTAT voltage V_PTAT and the second output node N2, to provide a variable resistance value VRP, varying according to the second control signal SS200.

Referring to FIGS. 1 through 4, the second voltage V2 is generated by the following Formula 1.

$$V2 = \text{V\_ZTAT}^2 + \frac{RZ}{RZ + VRP} * (\text{V\_PTAT} - \text{V\_ZTAT}^2), \quad \text{[Formula 1]}$$

where V2 is the second voltage V2, V_ZTAT2 is the second ZTAT voltage V_ZTAT2, VRP is the variable resistance value VRP, RZ is the second resistance value RZ, and V_PTAT is the PTAT voltage V_PTAT.

The variable resistor circuit 220 includes first to nth resistors R2-1 to R2-$n$, connected to each other in parallel, and first to nth switches SW2-1 to SW2-$n$, selecting the respective first to nth resistors R2-1 to R2-$n$ according to the second control signal SS200. In one example, the first switch SW2-1 selects the first resistor R2-1, and the nth switch SW2-$n$ selects the nth resistor R2-$n$.

Figure 5:
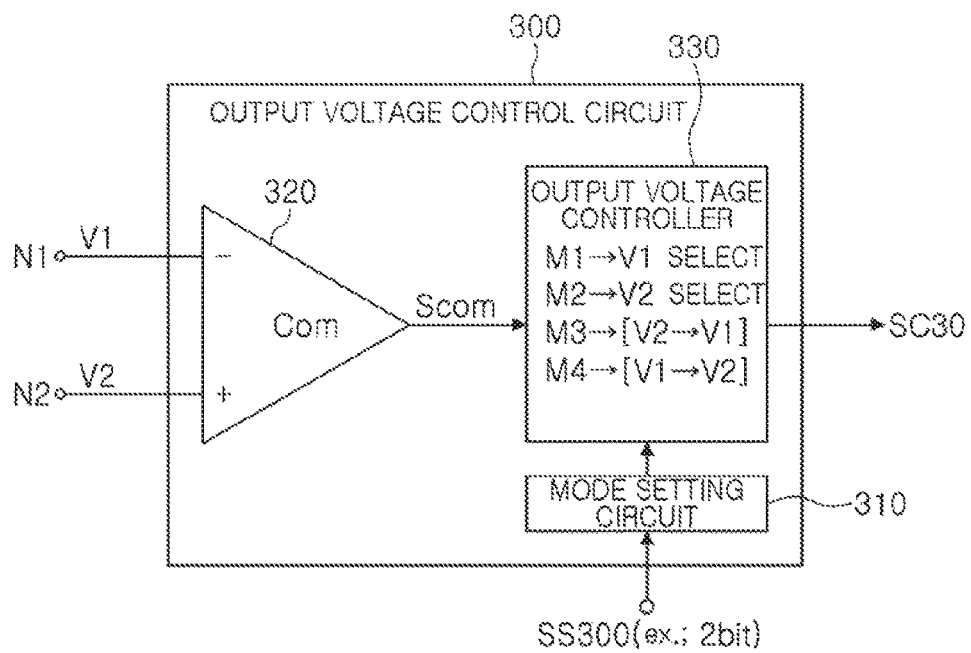
FIG. 5 is a circuit diagram of an example of an output voltage control circuit.

FIG. 5 is a circuit diagram of an example of the output voltage control circuit 300.

Referring to FIG. 5, the output voltage control circuit 300 includes a mode setting circuit 310, a comparison circuit 320, and an output voltage controller 330.

The mode setting circuit 310 sets one of the operating modes according to the mode selection signal SS300.

For example, the mode setting circuit 310 may set one of the first operating mode M1, the second operating mode M2, the third operating mode M3, and the fourth operating mode M4, according to the mode selection signal SS300.

In one example, the mode selection signal SS300 is a 2-bit signal that sets four operating modes.

The comparison circuit 320 compares the first voltage V1 with the second voltage V2 to provide a comparison result signal Scom to the output voltage controller 330.

The comparison circuit 320 includes an operational amplifier Com. In an example, the operational amplifier Com compares the first voltage V1 across an inverting input terminal with the second voltage V2 across a non-inverting input terminal. When the first voltage V1 is higher than the second voltage V2, the comparison result signal Scom may have a low level, and when the first voltage V1 is lower than the second voltage V2, the comparison result signal Scom may have a high level.

The output voltage controller 330 provides an output voltage selection signal SC30 in response to the operating mode set by the mode setting circuit 310 and in response to the comparison result signal Scom from the comparison circuit 320.

In one example, when the mode setting circuit 310 sets the first operating mode M1, the output voltage controller 330 provides first and second switch signals SC31 and SC32 to have high and low levels, so as to control a first switch 410 (refer to FIG. 6) to be turned on, and a second switch 420 (refer to FIG. 6) to be turned off.

When the mode setting circuit 310 sets the second operating mode M2, the output voltage controller 330 provides the first and second switch signals SC31 and SC32, to have low and high levels, so as to control the first switch 410 to be turned off and the second switch 420 to be turned on.

When the mode setting circuit 310 sets the third operating mode M3, the output voltage controller 330 controls the first switch 410 to be turned off and the second switch 420 to be turned on, so as to select the second voltage V2 when the second voltage V2 is lower than the first voltage V1 and the output voltage controller 330 also controls the first switch 410 to be turned on and the second switch 420 to be turned off, so as to select the first voltage V1 when the second voltage V2 is higher than the first voltage V1, using the first and second switch signals SC31 and SC32.

When the mode setting circuit 310 sets the fourth operating mode M4, the output voltage controller 330 controls the first switch 410 to be turned on and the second switch 420 to be turned off, so as to select the first voltage V1 when the first voltage V1 is higher than the second voltage V2. The output voltage controller 330 also control the first switch 410 to be turned off and the second switch 420 to be turned on, so as to select the second voltage V2 when the first voltage V1 is lower than the second voltage V2, using the first and second switch signals SC31 and SC32.

Figure 6:
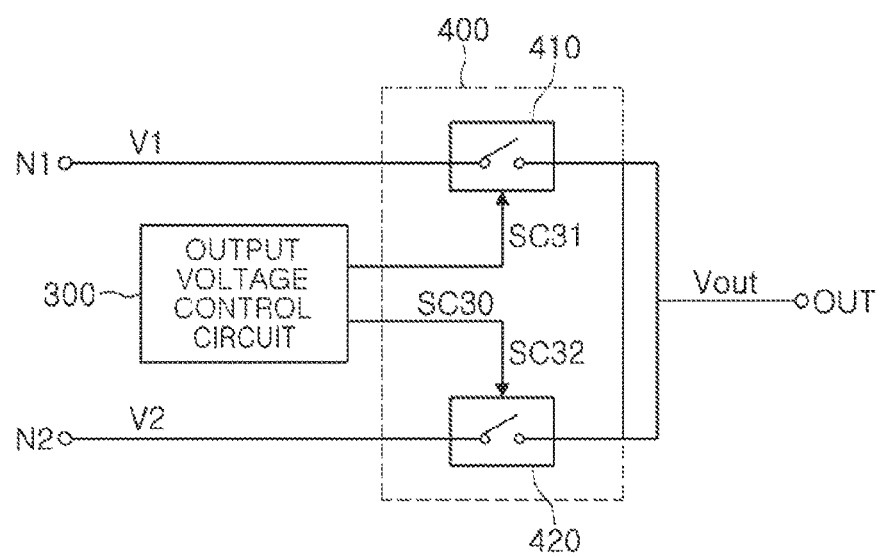
FIG. 6 is a circuit diagram of an example of a voltage selection circuit.

FIG. 6 is a circuit diagram of an example of the voltage selection circuit 400.

Referring to FIG. 6, the voltage selection circuit 400 includes the first switch 410 and the second switch 420.

The first switch 410 switches according to the first switch signal SC31, included in the output voltage selection signal SC30, to select and provide the first voltage V1 to an output terminal OUT.

The second switch 420 switches according to the second switch signal SC32, included in the output voltage selection signal SC30 and having a phase opposite that of the first switch signal SC31, to select and provide the second voltage V2 to the output terminal OUT.

For example, the voltage selection circuit 400, as discussed above, may control the first voltage V1, to be selected in the first operating mode M1, the second voltage V2 to be selected in the second operating mode M2, the second voltage V2 and the first voltage V1 to be sequentially selected as the temperature rises in the third operating mode M3, and the first voltage V1 and the second voltage V2 to be sequentially selected as the temperature rises, and may control the second voltage V2 and the first voltage V1 to be sequentially selected as the temperature falls, in the fourth operating mode M4.

Figure 7:
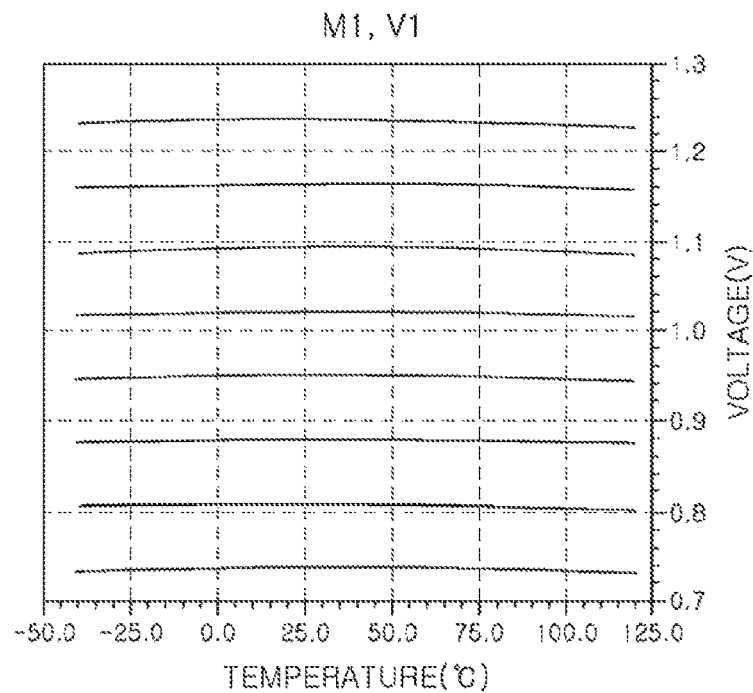
FIG. 7 is a graph of an example of a first temperature compensation voltage in a first operating mode.

FIG. 7 is a graph of an example of a first temperature compensation voltage in the first operating mode M1.

Referring to FIGS. 3 and 7, as mentioned above, in the case of the first operating mode M1, the first ZTAT voltage V_ZTAT1, corresponding to the first voltage V1, is provided. The first ZTAT voltage V_ZTAT1, as illustrated in FIG. 7, is varied using the first resistor circuit 110 and the switch circuit 120 of FIG. 3.

Figure 8:
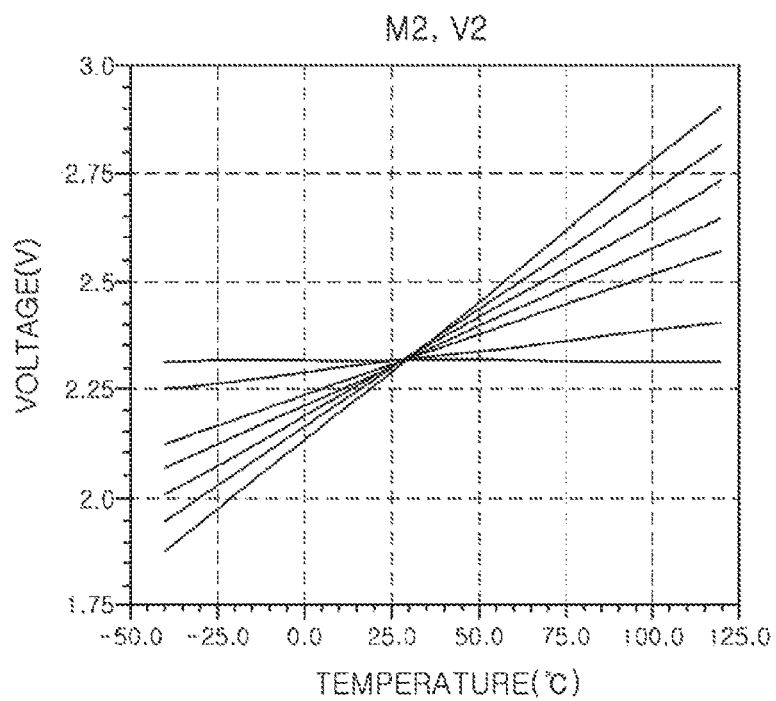
FIG. 8 is a graph of an example of a second temperature compensation voltage in a second operating mode.

FIG. 8 is a graph of an example of a second temperature compensation voltage in the second operating mode M2.

Referring to FIGS. 4 and 8, as described above, in the case of the second operating mode M2, the second voltage V2, obtained by adding the second ZTAT voltage V_ZTAT2 and the PTAT voltage V_PTAT according to a resistance ratio, is provided. In an example, the slope of the second voltage V2 is changed according to the resistance ratio of the second ZTAT voltage V_ZTAT2 and the PTAT voltage V_PTAT.

Figure 9A:
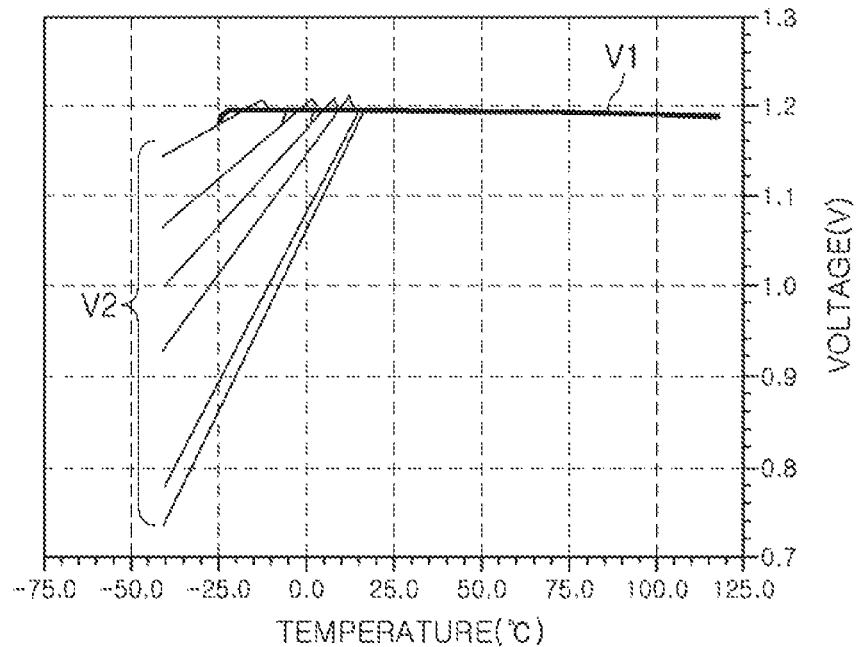
FIGS. 9A and 9B are graphs of examples of a temperature compensation voltage in a third operating mode.
Figure 9B:
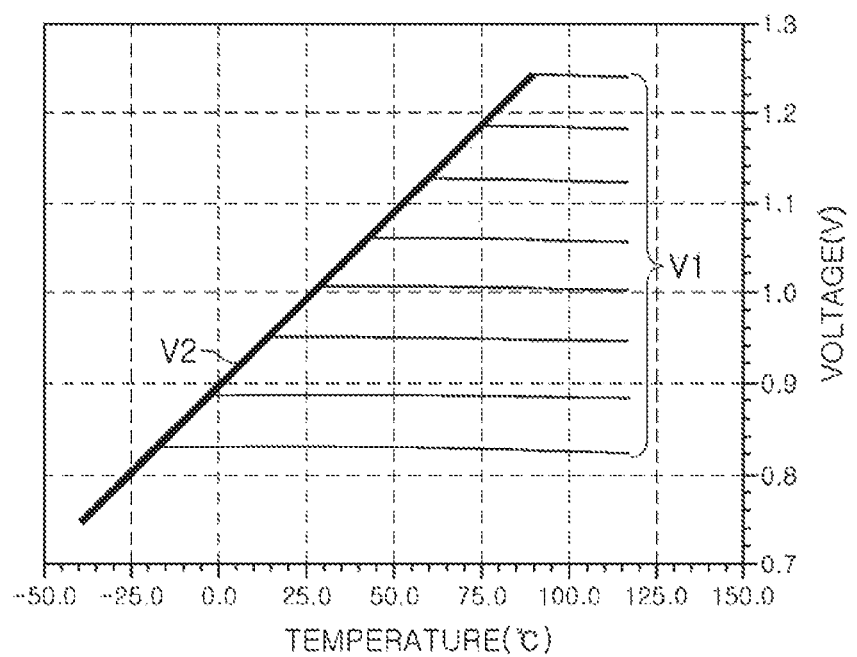

FIGS. 9A and 9B are graphs of examples of a temperature compensation voltage in the third operating mode M3.

Referring to FIGS. 3 through 6 and 9, as discussed above, in the case of the third operating mode M3, when the second voltage V2 is lower than the first voltage V1, the second voltage V2 is selected first, and when the second voltage V2 is higher than the first voltage V1, the first voltage V1 is selected.

As illustrated in FIG. 9A, the slope of the second voltage V2 is changed in the manner described above.

As illustrated in FIG. 9B, the magnitude of the first voltage V1 is changed in the manner described above.

Figure 10A:
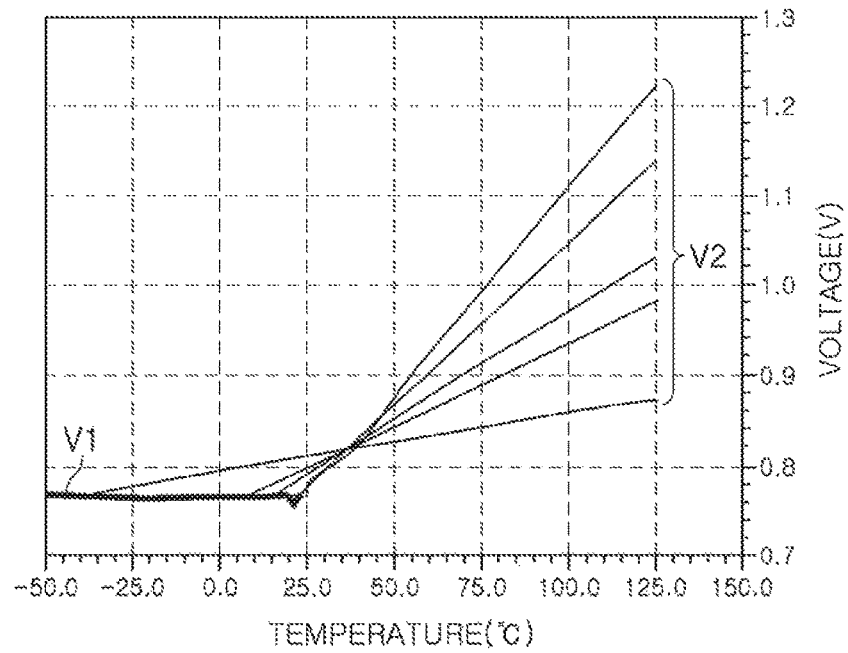
FIGS. 10A and 10B are graphs of examples of a temperature compensation voltage in a fourth operating mode.
Figure 10B:
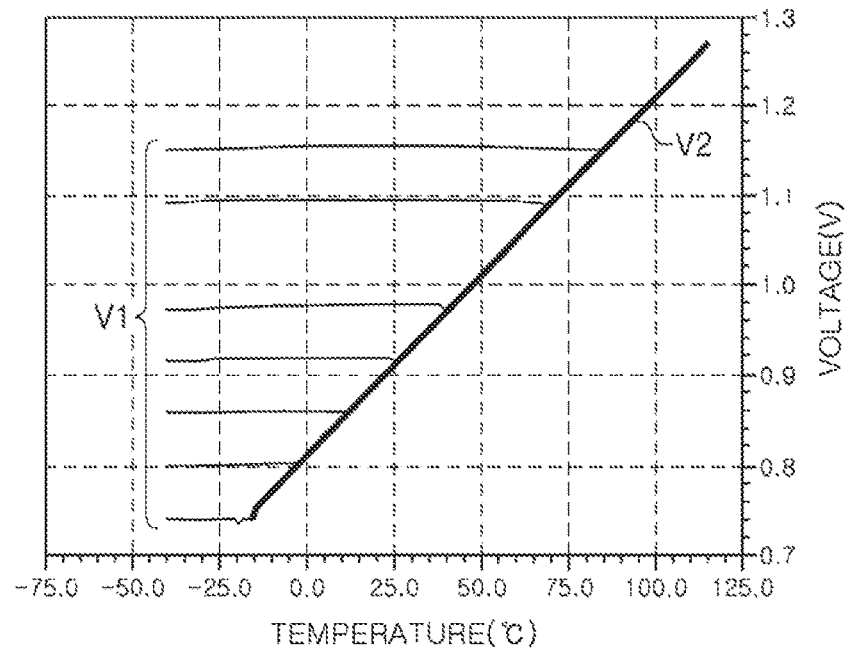

FIGS. 10A and 10B are graphs of examples of a temperature compensation voltage in the fourth operating mode M4.

Referring to FIGS. 3 through 6 and 10, as mentioned above, in the case of the fourth operating mode M4, when the first voltage V1 is higher than the second voltage V2, the first voltage V1 is selected first, and when the first voltage V1 is lower than the second voltage V2, the second voltage V2 is selected.

As illustrated in FIG. 10A, the slope of the second voltage V2 is changed in the manner described above.

As illustrated in FIG. 10B, the magnitude of the first voltage V1 is changed in the manner described above.

As set forth above, according to the examples, a voltage generation circuit selects one of a proportional-to-absolute temperature (PTAT) characteristic, a zero-to-absolute-temperature (ZTAT), and a combination thereof, in lieu of a method of adjusting the slope of temperature coefficients, thus exhibiting various temperature compensation characteristics, and may apply this selection to respective circuits having various temperature coefficients.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A voltage generation circuit having a temperature compensation function, comprising:

a first voltage generation circuit configured to generate a first voltage having a zero temperature coefficient, in response to a first control signal;
a second voltage generation circuit configured to generate a second voltage having a positive temperature coefficient, in response to a second control signal, and the second voltage generation circuit comprising a resistor circuit connected to a second output node of the second voltage generation circuit;
an output voltage control circuit configured to control an output of one of the first voltage and the second voltage in response to an operating mode among selectable operating modes; and
a voltage selection circuit configured to select one of the first voltage and the second voltage in response to the control from the output voltage control circuit.

2. The voltage generation circuit of claim 1, wherein the first voltage generation circuit comprises:
a first resistor circuit comprising resistors connected in series between a terminal receiving a first zero-to-absolute-temperature (ZTAT) voltage and a ground; and
a switch circuit comprising switches connected between each connection node between the resistors and a first output node of the first voltage generation circuit, the switch circuit configured to switch in response to the first control signal.

3. The voltage generation circuit of claim 1, wherein the resistor circuit comprises:
a second resistor circuit, connected between a terminal receiving a second ZTAT voltage and the second output node of the second voltage generation circuit, to provide a second resistance value; and
a variable resistor circuit, connected between a terminal receiving a proportional-to-absolute temperature (PTAT) voltage and the second output node, to provide a variable resistance value varying in response to the second control signal.

4. The voltage generation circuit of claim 1, wherein the output voltage control circuit comprises:
a mode setting circuit configured to set the operating mode in response to a mode selection signal;
a comparison circuit configured to compare the first voltage with the second voltage and output a comparison result signal; and
an output voltage controller configured to provide an output voltage selection signal in response to the operating mode set by the mode setting circuit and in response to the comparison result signal from the comparison circuit.

5. The voltage generation circuit of claim 4, wherein the voltage selection circuit comprises:
a first switch configured to switch in response to a first switch signal of the output voltage selection signal, to select and output the first voltage to an output terminal; and
a second switch configured to switch in response to a second switch signal of the output voltage selection signal, the second switch signal having a phase opposite a phase of the first switch signal, to select and output the second voltage to the output terminal.

6. The voltage generation circuit of claim 5, wherein the mode setting circuit is configured to perform the temperature compensation function by setting the operating mode in response to the mode selection signal, and the setting of the operating mode in response to the mode selection signal comprises setting one of a first operating mode, a second operating mode, a third operating mode, and a fourth operating mode, among the selectable operating modes.

7. The voltage generation circuit of claim 6, wherein the output voltage controller is configured to:
control the first switch to turn on, in response to the first and second switch signals, in response to the mode setting circuit setting the first operating mode;
control the second switch to turn on, in response to the first and second switch signals, in response to the mode setting circuit setting the second operating mode;
control the second switch to turn on to select the second voltage upon the second voltage being lower than the first voltage, and control the first switch to turn on to select the first voltage upon the second voltage being higher than the first voltage, in response to the first and second switch signals in the third operating mode set by the mode setting circuit; and
control the first switch to turn on to select the first voltage when the first voltage is higher than the second voltage, and control the second switch to be turned on to select the second voltage when the first voltage is lower than the second voltage, in response to the first and second switch signals in the fourth operating mode set by the mode setting circuit.

8. A voltage generation circuit having a temperature compensation function, comprising:
a first voltage generation circuit configured to generate a first voltage by varying a first zero-to-absolute-temperature (ZTAT) voltage having a zero temperature coefficient in response to a first control signal;
a second voltage generation circuit configured to generate a second voltage based on a second ZTAT voltage having a zero temperature coefficient and a proportional-to-absolute temperature (PTAT) voltage having a positive temperature coefficient in response to a second control signal, and the second voltage generation circuit comprising a resistor circuit connected to a second output node of the second voltage generation circuit;
an output voltage control circuit configured to control an output of one of the first voltage and the second voltage, based on the magnitudes of the first voltage and the second voltage, in response to setting of an operating mode among selectable operating modes; and
a voltage selection circuit configured to select one of the first voltage and the second voltage in response to the control of the output voltage control circuit.

9. The voltage generation circuit of claim 8, further comprising:
a first buffer connected between the first voltage generation circuit and the voltage selection circuit; and
a second buffer connected between the second voltage generation circuit and the voltage selection circuit.

10. The voltage generation circuit of claim 8, wherein the first voltage generation circuit comprises:
a first resistor circuit comprising resistors connected in series each to the other between a terminal receiving the first ZTAT voltage and a ground; and
a switch circuit comprising switches connected between each connection node between the resistors and a first output node of the first voltage generation circuit, and configured to switch in response to the first control signal.

11. The voltage generation circuit of claim 8, wherein the resistor circuit comprises:
a second resistor circuit connected between a terminal receiving a second ZTAT voltage and the second output node of the second voltage generation circuit, to provide a second resistance value; and
a variable resistor circuit connected between a terminal receiving the PTAT voltage and the second output node, to provide a variable resistance value varying in response to the second control signal,
wherein $$V^2 = V\_ZTAT^2 + \frac{RZ}{RZ+VRP} * (V\_PTAT - V\_ZTAT^2),$$

where V2 is the second voltage, V_ZTAT2 is the second ZTAT voltage, VRP is the variable resistance value, RZ is the second resistance value, and V_PTAT is the PTAT voltage.

12. The voltage generation circuit of claim 8, wherein the output voltage control circuit comprises:
a mode setting circuit configured to set the operating mode in response to a mode selection signal;
a comparison circuit configured to compare the first voltage with the second voltage and output a comparison result signal; and
an output voltage controller configured to provide an output voltage selection signal in response to the operating mode set by the mode setting circuit and in response to the comparison result signal from the comparison circuit.

13. The voltage generation circuit of claim 12, wherein the voltage selection circuit comprises:
a first switch configured to switch in response to a first switch signal of the output voltage selection signal, to select and output the first voltage to an output terminal; and
a second switch configured to switch in response to a second switch signal of the output voltage selection signal, the second switch signal having a phase opposite to a phase of the first switch signal, to select and output the second voltage to the output terminal.

14. The voltage generation circuit of claim 13, wherein the setting of the operating mode in response to the mode selection signal comprises setting one of a first operating mode, a second operating mode, a third operating mode, and a fourth operating mode, among the selectable operating modes.

15. The voltage generation circuit of claim 14, wherein the output voltage controller is configured to:
control the first switch to turn on in response to the first and second switch signals upon the mode setting circuit setting the first operating mode;
control the second switch to turn on in response to the first and second switch signals upon the mode setting circuit setting the second operating mode;
control the second switch to turn on to select the second voltage upon the second voltage being lower than the first voltage, and control the first switch to turn on to select the first voltage upon the second voltage being higher than the first voltage, in response to the first and second switch signals in the third operating mode set by the mode setting circuit; and
control the first switch to turn on to select the first voltage upon the first voltage being higher than the second voltage, and control the second switch to turn on to select the second voltage upon the first voltage being lower than the second voltage, in response to the first and second switch signals in the fourth operating mode being set by the mode setting circuit.

16. A voltage generation circuit having a temperature compensation function, comprising:
a first voltage generation circuit configured to generate a first voltage having a zero temperature coefficient, in response to a first control signal;
a second voltage generation circuit configured to generate a second voltage having a positive temperature coefficient, in response to a second control signal, the second voltage generation circuit comprising a resistor circuit connected between a terminal receiving a second ZTAT voltage and an output node of the second voltage generation circuit to provide a second resistance value;
an output voltage control circuit configured to control an output of one of the first voltage and the second voltage in response to an operating mode; and
a voltage selection circuit configured to select one of the first voltage and the second voltage in response to the control of the output by the output voltage control circuit.

17. The voltage generation circuit of claim 16, further comprising a variable resistor circuit, connected between a terminal receiving a proportional-to-absolute temperature (PTAT) voltage and the output node to provide a variable resistance value varying in response to the second control signal.

18. The voltage generation circuit of claim 17, wherein the output voltage control circuit comprises:
a mode setting circuit configured to set the operating mode in response to a mode selection signal;
a comparison circuit configured to compare the first voltage with the second voltage and output a comparison result signal; and
an output voltage controller configured to provide an output voltage selection signal in response to the operating mode set by the mode setting circuit and in response to the comparison result signal from the comparison circuit.

19. The voltage generation circuit of claim 18, wherein the voltage selection circuit comprises:
a first switch configured to switch in response to a first switch signal of the output voltage selection signal, to select and output the first voltage to an output terminal; and
a second switch configured to switch in response to a second switch signal of the output voltage selection signal, to select and output the second voltage to the output terminal, the second switch signal comprising a phase opposite a phase of the first switch signal.

* * * * *